(12) United States Patent
Zhang et al.

(10) Patent No.: US 10,358,579 B2
(45) Date of Patent: Jul. 23, 2019

(54) CMP COMPOSITIONS AND METHODS FOR POLISHING NICKEL PHOSPHOROUS SURFACES

(71) Applicant: Cabot Microelectronics Corporation, Aurora, IL (US)

(72) Inventors: Ke Zhang, Singapore (SG); Michael White, Ridgefield, CT (US); Tsung-Ho Lee, Tainan (TW); Steven Grumbine, Aurora, IL (US); Hon-Wu Lau, Singapore (SG)

(73) Assignee: Cabot Microelectronics Corporation, Aurora, IL (US)

( * ) Notice: Subject to any disclaimer, the term of this patent is extended or adjusted under 35 U.S.C. 154(b) by 408 days.

(21) Appl. No.: 14/094,921

(22) Filed: Dec. 3, 2013

(65) Prior Publication Data
US 2015/0152289 A1  Jun. 4, 2015

(51) Int. Cl.
| | |
|---|---|
| *G09G 1/18* | (2006.01) |
| *C23F 3/06* | (2006.01) |
| *C09G 1/02* | (2006.01) |
| *H01L 21/304* | (2006.01) |
| *H01L 21/306* | (2006.01) |
| *H01L 21/321* | (2006.01) |
| *C09G 1/18* | (2006.01) |

(52) U.S. Cl.
CPC ............... *C09G 1/02* (2013.01); *C09G 1/18* (2013.01); *C23F 3/06* (2013.01); *H01L 21/304* (2013.01); *H01L 21/30625* (2013.01); *H01L 21/3212* (2013.01); *H01L 21/32115* (2013.01)

(58) Field of Classification Search
None
See application file for complete search history.

(56) References Cited

U.S. PATENT DOCUMENTS 6,015,506 A * 1/2000 Streinz et al. ............ 252/186.1
6,136,711 A   10/2000 Grumbine et al.
(Continued)

FOREIGN PATENT DOCUMENTS

EP      1118647    *  7/2001

OTHER PUBLICATIONS

Hong Lei, Jianbin Luo; "CMP of hard disk substrate sing colloidal silica slurry: preliminary experimental investigation"; Wear; 2004; 257: 461-470.

(Continued)

*Primary Examiner* — Stephanie P Duclair
(74) *Attorney, Agent, or Firm* — Thomas Omholt; Erika S. Wilson

(57) ABSTRACT

Chemical mechanical polishing (CMP) compositions and methods for planarizing a nickel phosphorus (NiP) substrate are described. A NiP CMP method comprises abrading a surface of the substrate with a CMP composition. The CMP composition comprises a colloidal silica abrasive suspended in an aqueous carrier having a pH of less than 2, and containing a primary oxidizing agent comprising hydrogen peroxide, a secondary oxidizing agent comprising a metal ion capable of reversible oxidation and reduction in the presence of NiP and hydrogen peroxide, a chelating agent, and glycine. The chelating agent comprises two or three carboxylic acid substituents capable of chelating to the metal ion of the secondary oxidizing agent.

11 Claims, 2 Drawing Sheets

(56) References Cited

U.S. PATENT DOCUMENTS

| | | | |
|---|---|---|---|
| 6,280,490 B1 | 8/2001 | Rader et al. | |
| 6,309,434 B1 * | 10/2001 | Ohashi | 51/308 |
| 6,488,729 B1 | 12/2002 | Ishitobi et al. | |
| 6,569,215 B2 * | 5/2003 | Miyata | 51/307 |
| 2004/0029495 A1 * | 2/2004 | Small | B24B 37/044 |
| | | | 451/41 |
| 2010/0009537 A1 * | 1/2010 | Balasubramaniam | C09G 1/02 |
| | | | 438/692 |
| 2010/0193470 A1 * | 8/2010 | Palanisamy Chinnathambi | |
| | | | C09K 3/1463 |
| | | | 216/53 |
| 2010/0308016 A1 * | 12/2010 | Chinnathambi | C09G 1/02 |
| | | | 216/89 |

OTHER PUBLICATIONS

Hong Lei et al. "Preparation and polishing properties of sherical porous silica abrasive"; Am. J. Nanotech.; 2010; 1: 32-39.

* cited by examiner

CMP COMPOSITIONS AND METHODS FOR POLISHING NICKEL PHOSPHOROUS SURFACES

FIELD OF THE INVENTION

This invention relates to chemical mechanical polishing (CMP) compositions and methods. More particularly, this invention relates to CMP methods for polishing of nickel phosphorus (NiP) surfaces, e.g., for rigid disk applications.

BACKGROUND

Compositions and methods for CMP of the surface of a substrate are well known in the art. Polishing compositions (also known as polishing slurries, CMP slurries, and CMP compositions) for CMP of surfaces of semiconductor substrates (e.g., for integrated circuit manufacture) typically contain an abrasive, various additive compounds, and the like. Compositions for polishing nickel phosphorus (NiP) surfaces in rigid disk (hard drive) manufacture are known in the art. Such compositions typically utilize a silica or alumina abrasive, a primary oxidizing agent (e.g., hydrogen peroxide) and a secondary oxidizing agent (e.g., ferric ion).

In conventional CMP techniques, a substrate carrier or polishing head is mounted on a carrier assembly and positioned in contact with a polishing pad in a CMP apparatus. The carrier assembly provides a controllable pressure to the substrate, urging the substrate against the polishing pad. The pad and carrier, with its attached substrate, are moved relative to one another. The relative movement of the pad and substrate serves to abrade the surface of the substrate to remove a portion of the material from the substrate surface, thereby polishing the substrate. The polishing of the substrate surface typically is further aided by the chemical activity of the polishing composition (e.g., by oxidizing agents, acids, bases, or other additives present in the CMP composition) and/or the mechanical activity of an abrasive suspended in the polishing composition. Typical abrasive materials include silicon dioxide, cerium oxide, aluminum oxide, zirconium oxide, and tin oxide.

U.S. Pat. No. 6,015,506 discloses a polishing composition including silica or alumina, an oxidizer (either $H_2O_2$ or potassium peroxymonosulfate) and a metal catalyst such as ferric nitrate in water solution at pH 2 to 7. This patent speculates that the use of additives such as phosphoric acid or an organic acid may reduce the oxidizer decomposition rate, but also may adversely affect the NiP removal rate. U.S. Pat. No. 6,280,490 discloses a polishing composition including an abrasive such as silica or alumina, a peroxydisulfate-based oxidizer and a ferric salt such as ferric nitrate, ferric sulfate or a ferric complex salt such as iron (III) citrate and iron (III) EDTA in water at pH 2 and greater. However, there is no teaching regarding the oxidizer and removal rate stability. The slurries of U.S. Pat. No. 6,280,490 that contained complexed iron salts afforded lower removal rates than those with non-complexed iron salts, although the comparison was made at different pH values. U.S. Pat. No. 6,309,434 discloses a polishing composition including silica as the abrasive, $H_2O_2$ as the oxidizer, ferric nitrate as a "polishing accelerator" and citric acid as a stabilizer, at a pH of greater than 2. U.S. Pat. No. 6,309,434 asserts that citric acid has an advantageous stabilizing effect compared to other stabilizers such as oxalic acid and malonic acid; however, this conclusion was based on results obtained without pH adjustment for different stabilizers for comparison at the same pH.

In order to improve manufacturing throughput for cost of ownership (CoO) reduction, high removal rate continues to be one of the top requirements for a first step NiP CMP slurry in the hard disk industry. Addition of ferric salts such as ferric nitrate in CMP slurry composition are known to improve removal rates due to the catalytic effect of the $Fe^{3+}$ ion on NiP oxidation when combined with primary oxidizers such as hydrogen peroxide and persulfate salts. However, the presence of ferric ion can cause fast decomposition of peroxy-based oxidizers and therefore result in unstable compositions and erratic polishing performance. While chelating agents (chelators) with high ferric ion binding constants, such as ethylenediaminetetraacetic acid (EDTA) and N-(hydroxyethyl)ethylenediaminetriacetic acid (HEDTA), may help to significantly inhibit the rapid catalytic decomposition of peroxy-oxidizers, such chelators typically reduce the polishing removal rates at the same time. As a consequence, there is an ongoing need for compositions and methods that can improve oxidizer stability without significantly compromising NIP material removal rates for ferric ion-catalyzed CMP slurries. The compositions and methods described herein addresses this need.

SUMMARY OF THE INVENTION

Chemical mechanical polishing compositions and methods for planarizing or polishing a nickel phosphorus (NiP) substrate are described herein. In one embodiment, a CMP method comprises abrading a surface of the substrate with a CMP composition. The CMP composition comprises a particulate abrasive suspended in an aqueous carrier having a pH of less than 2 (preferably less than 1.5), and containing an oxidizing agent, a metal ion catalyst capable of reversible oxidation and reduction in the presence of NiP and the oxidizer, a catalyst stabilizing agent, and a Ni complexing agent. The catalyst stabilizing agent comprises two or three carboxylic acid substituents capable of chelating to the metal ion catalyst. Preferably, the abrading is accomplished in conjunction with a polishing pad in a CMP polishing apparatus.

In some method embodiments, the components of the composition independently are present, at point of use, at concentrations of about 1 to about 20 percent by weight (wt. %) for the particulate abrasive; about 1 to about 1000 parts-per-million (ppm) for the metal ion catalyst; about 0.3 to about 3 wt % for the oxidizing agent; about 0.001 to about 2 wt % for the catalyst stabilizing agent, and, optionally, about 0.3 to about 6 wt % for the Ni complexing agent.

In another aspect, a CMP composition suitable for planarizing a NiP substrate comprises a particulate abrasive suspended in an aqueous carrier having a pH of less than 2, and containing a metal ion catalyst capable of reversible oxidation and reduction in the presence of NiP and the oxidizing agent (e.g., ions of iron, cobalt, copper, europium, manganese, tungsten, molybdenum, rhenium and iridium; preferably iron and preferably $Fe^{3+}$), a catalyst stabilizing agent, and Ni complexing agent. The stabilizing agent comprises two or three carboxylic acid substituents (e.g., oxalic acid, citric acid, malonic acid) capable of chelating to the metal ion catalyst.

In some CMP composition embodiments, the components of the composition independently are present at concentrations of about 1 to about 50 percent by weight (wt %) for colloidal silica; about 1 to about 2500 parts-per-million (ppm) for the metal ion catalyst; about 0.3 to about. 7.5 wt % for the oxidizing agent; about 0.001 to about 5 wt % for the stabilizing agent; and about 0.3 to about 15 wt % for the Ni complexing agent. The oxidizing agent generally is added to the composition shortly before use (e.g., a few hours before).

The compositions and methods described herein are particularly useful in planarization of NiP substrates for rigid disk applications, and surprisingly provide improved composition stability at very low pH (e.g., less than about 2) while maintaining commercially suitable NiP removal rates.

DETAILED DESCRIPTION OF THE PREFERRED EMBODIMENTS

Figure 1:
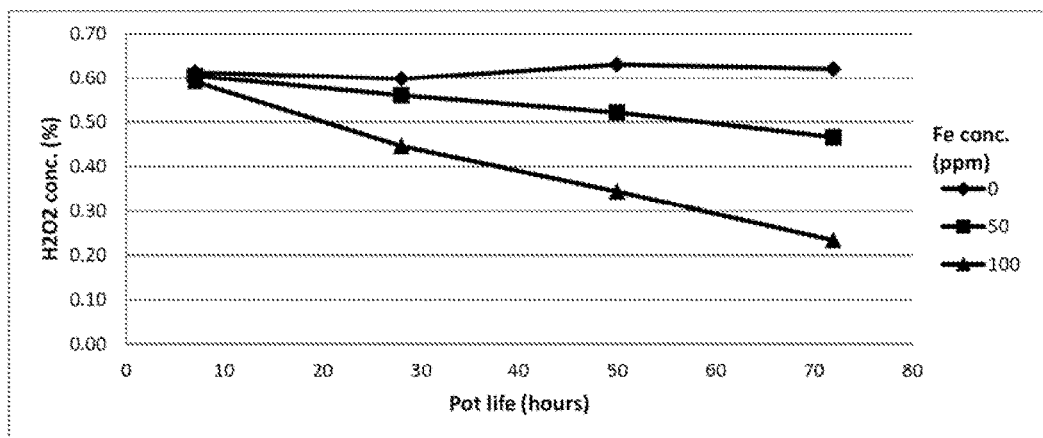
FIG. 1 provides a graph of $H_2O_7$ concentration versus tunic in hours (pot life) at different Fe ion concentrations.

Chemical mechanical polishing compositions and methods described herein utilize a slurry comprising a particulate abrasive suspended in an aqueous carrier having a pH of less than 2 an oxidizing agent, a metal ion catalyst capable of reversible oxidation and reduction in the presence of NiP and the oxidizing agent, a Ni complexing agent, and a catalyst stabilizing agent.

The catalyst stabilizing agent comprises two or three carboxylic acid substituents capable of chelating to the metal ion catalyst. Non-limiting examples of suitable stabilizing agents include oxalic acid, malonic acid, succinic acid, malic acid, tartaric acid, citric acid, glutaric acid, adipic acid, maleic acid, phthalic acid and iminodiacetic acid. In some embodiments, the chelating agent is selected from oxalic acid, citric acid, malonic acid, and a combination of two or more thereof. As used herein the terms "carboxylic acid" and "acid" as used in reference to stabilizing agents are meant to encompass the free acid form as well as salts (e.g., alkali metal salts). Preferably, the chelating agent is present at a concentration of about 0.001 to about 2 wt % at point of use, more preferably about 0.03 to about 0.4 wt %, e.g., about 0.04 to about 0.2 wt %, and preferably are present at a molar concentration of 2 or more times the molar concentration of the metal ion catalyst (e.g., 2 to 20 times the metal ion molar concentration, preferably about 2 to 10, or 2 to 5 times the metal ion molar concentration).

Without wishing to be bound by theory, it is believed that the Ni complexing agent in the polishing slurry aids in Ni removal by complexing with nickel ions formed during the polishing process. Preferably, the Ni complexing agent is an amino acid or carboxylic acid. Non-limiting examples of possible Ni complexing agents include glycine, alanine, aspartic acid, histidine, nitriloacetic acid, iminodiacetic acid, acetic acid, tartaric acid, citric acid, oxalic acid, lactic acid, glutaric acid, maleic acid, gluconic acid, malonic acid and glycolic acid. Preferably, the Ni complexing agent is glycine. Preferably, the Ni complexing agent is present in the composition at a concentration of about 0.3 to about 6 wt %, e.g., about 0.3 to about 1 wt %, at point of use.

The metal ion catalyst is capable of reversible oxidation and reduction in the presence of NiP and an oxidizing agent (e.g., hydrogen peroxide). Any suitable metal ion catalyst may be used. Preferred metal ions include ions of iron, cobalt, copper, europium, manganese, rhenium, molybdenum, iridium and tungsten. Non-limiting examples of such metal ions include $Fe^{2+}$, $Fe^{3+}$, $Co^{2+}$, $Cu^{2+}$, $Eu^{3+}$, $Mn^{2+}$, $W^{6+}$, $Re^{7+}$, $Mo^{5+}$ and $Ir^{3+}$. Preferably, the metal ion is or comprises $Fe^{3+}$. Typically, the metal ion is included in the CMP composition as a soluble salt, for example, a nitrate, a halide (e.g., chloride), a sulfate, and the like. Optionally, the metal ion can be included in the slurry as a salt with the stabilizing agent, e.g., a malonic acid salt, citric acid salt, and the like.

The metal ion catalyst is, preferably, present in the composition (at point of use) at a concentration of greater than about 1 ppm (e.g., about 5 ppm, about 10 ppm, about 20 ppm, about 50 ppm, about 100 ppm). The metal ion catalyst is, preferably, present in the composition (at point of use) at a concentration of less than about 1000 ppm (e.g., about 750 ppm, about 500 ppm, about 250 ppm, about 150 ppm, about 125 ppm). The metal ion catalyst may be present in the composition (at point of use) at a concentration range bounded by any of the aforementioned concentrations, for example, about 1 to about 1000 ppm, preferably about 20 to about 250 ppm, e.g., about 50 to about 150 ppm.

The oxidizing agent comprises, consists essentially of, or consists of hydrogen peroxide, optionally in combination with periodic acid, or a peroxy-based oxidizer such as a peroxymonosulfate or peroxydisulfate salt. The inventive CMP composition comprises, at point of use, a concentration of the oxidizing agent of about 0.1 wt. % or greater (e.g., about 0.2 wt. %, 0.3 wt. %, 0.5 wt. %, 0.7 wt. %). The concentration of the oxidizing agent may be about 4.0 wt. % or less (e.g., about 3 wt. %, about 2.5 wt. %, about 2 wt. %, about 1.8 wt. %, about 1.5 wt. %, about 1.25 wt. % about 1 wt. %), The concentration of oxidizing agent may within the range bounded by any two of the foregoing endpoints. For example, the concentration range of the oxidizing agent may be, without limitation, about 0.3 wt. % to about 3 wt. %, about 0.2 wt. % to about 2.5 wt. %, about 0.3 to about 1.8 wt. %, of the oxidizing agent (e.g., hydrogen peroxide).

The particulate abrasive can comprise any abrasive material suitable for use in CMP of memory or rigid disk substrates, semiconductor, and integrated circuit materials. Examples of such materials include, e.g., silica, ceria, alumina, zirconia, and titania. A preferred particulate abrasive comprises, consists essentially of or consists of silica (e.g., colloidal silica). In some embodiments, a mixed abrasive system comprising e.g., alumina and silica can be utilized. The abrasive may be of any suitable particle size. Preferably, the particulate abrasive has a mean particle size of about 4 to about 500 nm. Colloidal silica is a preferred abrasive material.

The compositions of the present invention have a pH of less than 2, preferably a pH of less than 1.8, preferably a pH of less than 1.5 (e.g., a pH of about 1 to about 1.8, a pH of about 1 to about 1.5). The pH of the composition can be achieved and/or maintained by inclusion of an acidic buffering material if desired. Acidic buffers are well known to those of ordinary skill in the chemical arts.

The polishing compositions described herein optionally also can include suitable amounts of one or more other additive materials commonly included in polishing compositions, such as dispersants, viscosity modifying agents, biocides, nonionic surfactants, and the like. For example, the composition can include a biocide such as KATHON or NEOLONE biocides. In some preferred embodiments, the CMP composition is free from viscosity modifying agents such as carboxymethylcellulose, and the like.

The aqueous carrier can be any aqueous solvent, e.g., water, aqueous methanol, aqueous ethanol, a combination thereof, and the like. Preferably, the aqueous carrier comprises predominately water (e.g., deionized water).

The polishing compositions used in the methods described herein can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., abrasive, catalyst stabilizing agent, metal ion catalyst, Ni complexing agent, buffers, oxidizing agent, and the like), as well as any combination of ingredients. For example, the abrasive can be dispersed in water, combined with the metal ion catalyst, catalyst stabilizing agent, and Ni complexing agent components, and mixed by any method that is capable of incorporating the components into the polishing composition. Typically, the oxidizing agent is not added to the CMP composition until the composition is ready for use in a CMP process, for example, the oxidizing agent can be added shortly before initiation of polishing. The pH can be further adjusted at any suitable time by addition of an acid or base, as needed.

The polishing compositions of the present invention also can be provided as a concentrate, which is intended to be diluted, with an appropriate amount of aqueous solvent (e.g., water) prior to use. In such an embodiment, the polishing composition concentrate can include the various components dispersed or dissolved in aqueous solvent in amounts such that, upon dilution of the concentrate with an appropriate amount of aqueous solvent, each component of the polishing composition will be present in the polishing composition in an amount within the appropriate range for use.

The compositions and methods of the invention surprisingly provide enhanced oxidizer stability while still affording commercially suitable removal rates when polishing a NiP surface. Without intending to be bound by theory, we have discovered that in order to achieve significant NiP removal rates while maintaining stability of the oxidizing agent (e.g., hydrogen peroxide), the pH of a polishing slurry should be highly acidic (e.g., pH less than about 2, preferably less than about 1.5), while the combination of the catalyst stabilizing agent with the Ni complexing agent, stabilize the oxidizer and aid in nickel ion removal from the substrate.

The CMP methods of the invention preferably are achieved using a chemical-mechanical polishing apparatus. Typically, the CMP apparatus comprises a platen, which, when in use, is in motion and has a velocity that results from orbital, linear, and/or circular motion, a polishing pad in contact with the platen and moving relative to the platen when in motion, and a carrier that holds a substrate to be polished by contacting and moving relative to the surface of the polishing pad. The polishing of the substrate takes place by the substrate being placed in contact with the polishing pad and a polishing composition of the invention and then moving the polishing pad relative to the substrate so as to abrade at least a portion of the substrate to polish the substrate.

The following examples further illustrate certain aspects of the invention but, of course, should not be construed as in any way limiting its scope. As used herein and in the following examples and claims, concentrations reported as parts-per-million (ppm) or percent by weight (wt. %) are based on the weight of the active component of interest divided by the weight of the composition.

General Experimental Procedure

All NiP disks were polished using a 6EE DOUBLE SURFACE POLISHMETER (from Strasbaugh, San Jose, Calif.). Twenty five disks were polished in each run at a slurry flow rate of about 400 mL/min with a CR200 polishing, pad (from Ceiba Technologies, Chandler Ariz.), at a down force of about 130 kg, an upper platen speed of about 20 revolutions-per-minute (rpm), a lower platen speed of about 30 rpm, and a carrier speed of about 5 rpm. Weight measurements were made on five disks to determine the material removal rates (RR, in mg/min). The slurries comprised (a) abrasive (variable amounts); (b) hydrogen peroxide (variable amounts); (c) metal ion catalyst (variable amounts); (d) Ni complexing agent (variable amounts); (e) catalyst stabilizing agent. (variable amounts); and (f) nitric acid (variable amounts for pH adjustment). As used herein, "variable amounts" refers to varying amount and identity of the specified component, and in some cases, the absence of the specified component in the slurry composition.

Example 1

Different carboxylic acids and amino acids were screened as Ni complexing agents for comparison. The polishing was performed at about pH 1.8 with 5 wt % colloidal silica ("Silica A", colloidal silica having a surface area about 80 $m^2/g$ (by titration) and a mean particle size of 40 nm, based on manufacturer information), 0.6 wt % hydrogen peroxide, with no metal ion catalyst, and no catalyst stabilizing agent. The polishing results shown in Table 1 show that the presence of a Ni complexing agent significantly improves the removal rate, with best complexing agent being glycine. Results of additional evaluations of glycine at different concentrations, with and without a metal ion catalyst, and with different silica type and loading are found in Table 2, which demonstrates that a glycine concentration of about 0.65 wt % provided the best performance.

TABLE 1

| Slurry | Ni complexer (87 mM) | RR (mg/min) |
| --- | --- | --- |
| S1 | Tartaric acid | 12.78 |
| S4 | citric acid | 10.2 |
| S5 | oxalic acid | 13.54 |
| S1 | Tartaric acid | 12.61 |
| S1 | Tartaric acid | 12.4 |
| S2 | Lactic acid | 11.77 |
| S3 | Glutaric acid | 13.38 |
| S4 | Maleic acid | 13.46 |
| S5 | Gluconic acid | 12.81 |
| S6 | Malonic acid | 12.22 |
| S7 | Glycolic acid | 13.41 |
| S8 | — | 9.96 |
| S1 | Tartaric acid | 12.67 |
| S1 | Tartaric acid | 13.54 |
| S2 | Glycine | 17.39 |
| S3 | Alanine | 13.8 |
| S4 | Aspartic acid | 14.26 |
| S5 | Histidine | 13.44 |
| S6 | Nitriloacetic acid | 12.67 |
| S7 | Iminodiacetic acid | 14.42 |
| S11 | acetic acid | 12.99 |
| S1 | Tartaric acid | 13.15 |

TABLE 2

| Slurry | Silica (wt % solids) | Fe (ppm) | Glycine (wt %) | pH | RR (mg/min) |
| --- | --- | --- | --- | --- | --- |
| S2A | A (5%) | 0 | 0.3 | 1.8 | 11.88 |
| S3A | A (5%) | 0 | 0.65 | 1.8 | 15.29 |
| S4A | A (5%) | 0 | 1 | 1.8 | 13.65 |

TABLE 2-continued

| Slurry | Silica (wt % solids) | Fe (ppm) | Glycine (wt %) | pH | RR (mg/min) |
|---|---|---|---|---|---|
| S5A | A (5%) | 0 | 2 | 1.8 | 10.06 |
| S1B | B (3%) | 50 | 0.65 | 1.3 | 21.41 |
| S2B | B (3%) | 50 | 0.75 | 1.3 | 19.56 |
| S3B | B (3%) | 50 | 0.55 | 1.3 | 21.3 |
| S1B | B (3%) | 50 | 0.65 | 1.3 | 23.07 |

In Table 2, Silica "A" is colloidal silica having a surface area of about 80 m$^2$/g (by titration) and a mean particle size of about 40 nm, and Silica "B" is colloidal silica having a surface area of about 80 m$^2$/g (by titration) and a mean particle size of about 34 nm, based on published information.

Example 2

This Example demonstrates the effect of a metal ion catalyst in a polishing NiP substrate. Table 3 illustrates the effect of iron concentration, demonstrating an increasing trend of removal rate with increasing iron content at the to 100 ppm range. Evaluations were run at pH 1.3, with 0.6 wt % hydrogen peroxide, 0.6 wt % glycine, and 3 wt % of colloidal silica B). For instance, a slurry with 50 ppm of Fe$^{3+}$ (as Fe(NO$_3$)$_3$) exhibited a 1.4% improvement in removal rate compared to a slurry without any metal ion catalyst. Table 4 illustrates a similar removal rate improvement effect of Fe(NO$_3$)$_3$ for a mixed abrasive system (fumed alumina, colloidal alumina, and colloidal silica). Evaluations in Table 4 were run with 1.2 wt % hydrogen peroxide, 0.8 wt % tartaric acid (as a Ni complexing agent), and 108 ppm of an ethoxylated-propoxylated silicone block copolymer surfactant (SILWET 7200 approximate ratio of silicone-to-ethylene oxide-to-propylene oxide of about 35:40:25, based on manufacturer information) at pH 1.8. A number of other metal salts as metal ion catalysts (listed in Table 5) were found to have comparable, or slightly less, removal rate improvement when compared to Fe(NO$_3$)$_3$, including cobalt (II) nitrate copper (II) nitrate, europium (III) nitrate, manganese (II) nitrate, tungsten (VI) chloride, molybdenum (V) chloride, iridium (III) chloride and methyl trioxorhenium (VII). Evaluations in Table 5 were run with 1.2 hydrogen peroxide, 3 wt % Silica B, and 0.6 wt % glycine, at pH 1.3, with the metal ion catalysts at the same molar concentration of 50 ppm Fe from ferric nitrate. However, because these compositions did not contain the catalyst stabilizing agent, titration results shown in FIG. 1 demonstrates that the H$_2$O$_2$ decomposition rate increased dramatically with an increase metal ion catalyst content.

TABLE 3

| Slurry | Fe (ppm) | RR (mg/min) |
|---|---|---|
| S1C | 50 | 27.06 |
| S4C | 0 | 23.88 |
| S5C | 75 | 27.97 |
| S6C | 100 | 32.54 |
| S1C | 50 | 27.43 |

TABLE 4

| Particles (wt % solids) | Fe (ppm) | Fe complexer (%) | RR (mg/min) |
|---|---|---|---|
| α-Alumina (0.525%) + Fumed alumina (0.131%) + Silica A (1.97%) | 0 | — | 26.78 |
| α-Alumina (0.525%) + Fumed alumina (0.131%) + Silica A (1.97%) | 100 | Malonic acid (0.0931%) | 31.44 |

TABLE 5

| Slurry | Catalyst (equivalent molar to 50 ppm Fe) | RR (mg/min) |
|---|---|---|
| S1D | Iron (III) Nitrate | 20 |
| S4D | Cobalt (II) Nitrate | 18.4 |
| S1D | Iron (III) Nitrate | 20.3 |
| S6D | Copper (II) Nitrate | 18.7 |
| S7D | Europium (III) Nitrate | 19.7 |
| S8D | Manganese (II) Nitrate | 19.4 |
| S9D | Tungsten (VI) Chloride | 18.7 |
| S10D | Molybdenum (V) Chloride | 17.5 |
| S11D | Iridium (III) Chloride | 20.1 |
| S12D | Methyltrioxorhenium (VII) | 19.9 |
| S1D | Iron (III) Nitrate | 18.3 |

Example 3

Figure 2:
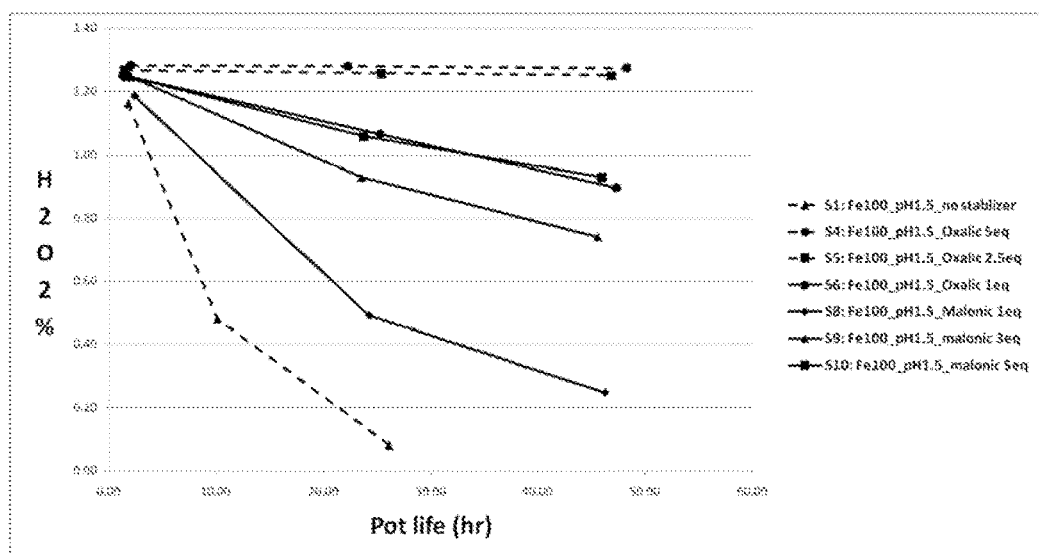
FIG. 2 provides a graph of $H_2O_2$ concentration versus time for different stabilizer types and concentrations.
Figure 3:
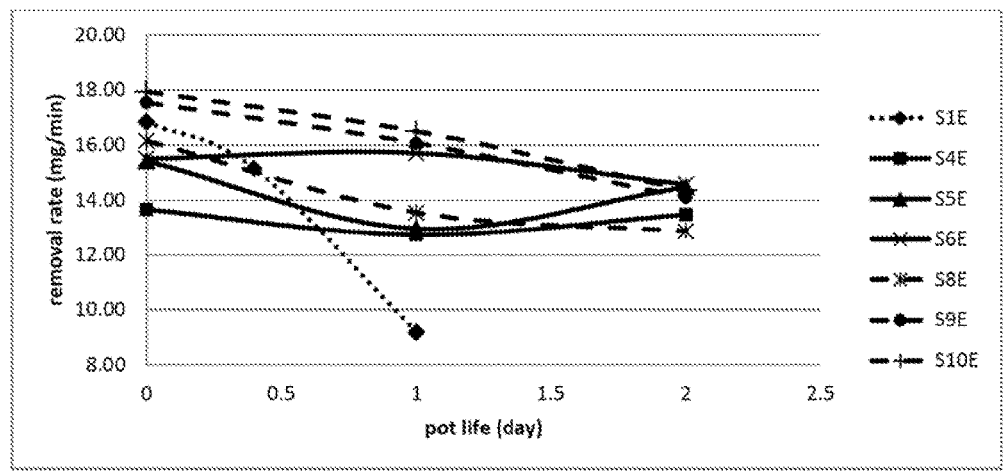
FIG. 3 provides a graph of removal rate vs. pot life for different stabilizer types and concentrations.

Different catalyst stabilizing agents were evaluated to assess the impact on peroxide decomposition and polishing performance. Table 6 lists catalyst stabilizing agents and concentration for slurries evaluated using Silica B (3 wt %)+Silica A (7 wt %), wt % hydrogen peroxide, 100 ppm of ferric ion as the metal ion catalyst, and 0.6 wt % glycine as the Ni complexing agent, at pH 1.5. The corresponding pot life results (in terms of H$_2$O$_2$ concentration) are shown in FIG. 2. Both oxalic acid and malonic acid exhibited a good stabilizing effect. The results show that the higher the stabilizer concentration, the slower the H$_2$O$_2$ decomposition. At the same molar concentration, oxalic acid provided a better stabilizing effect than malonic acid, likely due to a stronger complexation with iron. The polishing results, shown in FIG. 3, demonstrated a similar stability trend in terms of removal rate, in that both oxalic acid and malonic acid significantly reduced the removal rate drop over a 48-hour pot life. While oxalic acid leads to lower peroxide decomposition than malonic acid, it also reduced the fresh pot removal rate (Day 0) compared to a slurry without any stabilizer (S1E). On the contrary, malonic acid (S9E and S10E) surprisingly exhibited no such compromise on fresh pot removal rate.

TABLE 6

| Slurry | Fe chelator (concentration) |
|---|---|
| S1E | — |
| S4E | Oxalic acid (0.0806%) |
| S5E | Oxalic acid (0.0403%) |
| S6E | Oxalic acid (0.0161%) |
| S8E | Malonic acid (0.0186%) |
| S9E | Malonic acid (0.0559%) |
| S10E | Malonic acid (0.0931%) |

Example 4

Figure 4:
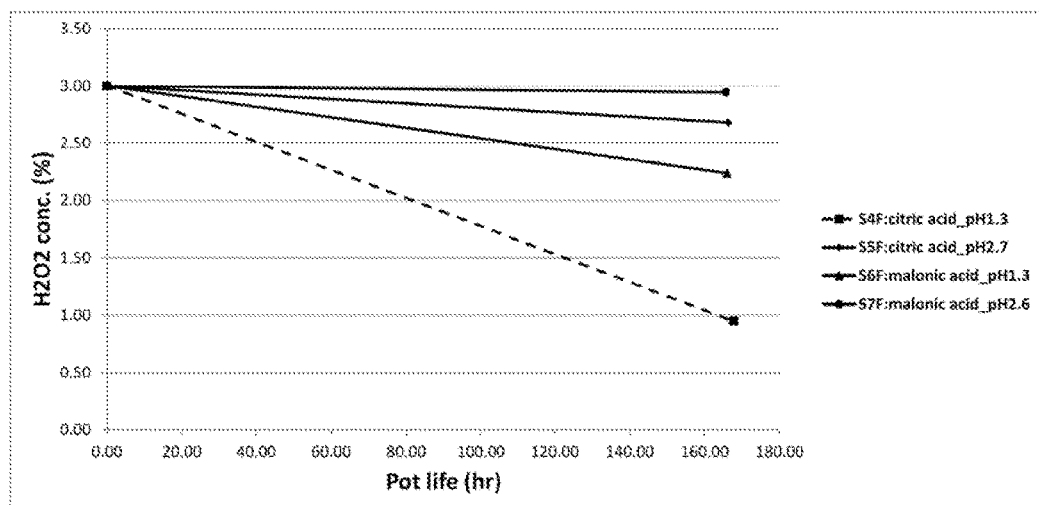
FIG. 4 provides a graph of $H_2O_2$ concentration versus time for different pH values and stabilizers.

A study was carried out to compare the methods of the present invention to those of patent U.S. Pat. No. 6,309,434, where it was reported that citric acid provided a better stability than malonic acid. Details of the slurry compositions tested in this example are provided in Table 7, Evaluations were run with 15 wt % Silica B, 3 wt % hydrogen peroxide, 400 ppm of ferric nitrate with the catalyst stabilization agent, pH adjustor, and PH shown in Table 7, but without glycine. Slurries No S5F and No S7F are the same composition as Slurries No. S4F and S6F, respectively, but without pH adjustment (i.e., as in U.S. Pat. No. 6,309,434). The polishing results in Table 7 demonstrate that citric acid provided a better removal rate than malonic acid at pH 2.6 to 2.7 (comparative example); however, when the pH was adjusted down to about 1.3 as described herein, malonic acid provided a better removal rate than citric acid. A one-week pot life study revealed that higher pH provided better stability for both stabilizers, likely due to better stabilizer coordination to the metal ion catalyst, $Fe^{3+}$. Malonic acid afforded a better removal rate stability (i.e., consistency of the removal rate over time) than citric acid at pH 1.3, while the two acids were about equally effective in stabilizing the removal rate at pH 2.6 to 2.7. The corresponding titration result in FIG. 4 reveals that malonic acid provided a better $H_2O_2$ stability than citric acid at both pH 1.3 and at pH 2.6 to 2.7. This result is opposite to the observations reported in U.S. Pat. No. 6,309,434.

TABLE 7

| Slurry | Stabilizing Agent (concentration) | pH adjustor | pH | RR @ 0 hr pot life (mg/min) | RR @ 166 hr pot life (mg/min) |
|---|---|---|---|---|---|
| S4F | Citric acid (0.4%) | $HNO_3$ | 1.3 | 17.36 | 15.95 |
| S5F | Citric acid (0.4%) | no adjustment | 2.7 | 13.37 | 13.87 |
| S6F | Malonic acid (0.2%) | $HNO_3$ | 1.3 | 17.99 | 17.55 |
| S7F | Malonic acid (0.2%) | no adjustment | 2.6 | 10.9 | 11.18 |

In summary, the inventive CMP compositions described herein (i.e., comprising a metal ion catalyst, a Ni complexing agent, a catalyst stabilization agent, an abrasive, and a peroxide-based oxidizing agent) provide enhanced material removal rates and improve removal rate stability for polishing NiP hard disk substrates. Malonic acid is the preferred catalyst stabilizing agent for preventing peroxide degradation without sacrificing the removal rate, when compared to oxalic acid and citric acid. This advantage is more significant at low pH of less than 1.5 (e.g., 1.3) compared to higher pH values (e.g., pH of about 2.6 to 2.7).

All references, including publications, patent applications, and patents, cited herein are hereby incorporated by reference to the same extent as if each reference were individually and specifically indicated to be incorporated by reference and were set forth in its entirety herein.

Example 5

This example demonstrates the ability of the inventive method to polish NiP substrates with and without the Ni complexing agent. This experiment was run on a Logitech table top polisher using the following settings; 1 psi downforce, 65 rpm platen speed, a slurry flow rate of 100 mL/min. A CR200 polishing pad was used (Ceiba Technologies). A separate Nickel phosphate (NiP) wafer having a composition of 12% phosphate and 88% nickel was polished for each treatment. The removal rates were determined by weight differential (final weight subtracted from initial weight) using an analytical balance. Because the industrial standard is to report removal rates in mg/min with a double sided polisher, the observed removal rates for this table top experiment were doubled to be consistent with reported rates.

The hydrogen peroxide decomposition was determined by analyzing the peroxide concentration of fresh slurry (1.2% hydrogen peroxide) and that of the slurry after tour days at room temperature. The peroxide concentrations were determined by titration method with potassium permanganate. The results are reported as the final peroxide concentration divided by the initial (original) peroxide concentration.

The treatments all had 1.2 wt. % hydrogen peroxide, 6 wt. % silica B, at pH 1.3. The treatments, as set forth below in Table 8, had either 0.6 wt. % glycine (100% glycine), a molar equivalent of malonic acid (100% malonic), or 0.3 wt. % glycine and the molar equivalent of malonic acid (50% glycine and 50% malonic).

The results shown in Table 8 indicate that removal rates increased with increasing ferric ion concentration. However, the stability of the hydrogen peroxide was a function of the amount of malonic acid present. For example, at 1.50 ppm ferric ion concentration, the removal rates were equivalent for the formulations having either 100% malonic or 100% glycine. The stability of the peroxide after 4 days at room temperature decreased from 0.904 to 0.011 for the 100% malonic and the 100% glycine, respectively. The results for the 50% malonic and 50% glycine, at 100 ppm ferric iron, showed a stability of 0.836, indicating that peroxide could be stabilized with lower concentrations of Platonic acid.

TABLE 8

| [Fe] (ppm) | % Malonic | % Glycine | RR (mg/min) | [H2O2]/[H2O2]o after 4 days |
|---|---|---|---|---|
| 50 | 0 | 100 | 22.36 | 0.329 |
| 100 | 50 | 50 | 23.42 | 0.836 |
| 150 | 0 | 100 | 26.31 | 0.011 |
| 150 | 100 | 0 | 26.11 | 0.904 |
| 50 | 100 | 0 | 22.19 | 1.01 |

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The terms "consisting of" and "consists of" are to be construed as closed terms, which limit any compositions or methods to the specified components or steps, respectively, that are listed in a given claim or portion of the specification. In addition, and because of its open nature, the term "comprising" broadly encompasses compositions and methods that "consist essentially of" or "consist of" specified components or steps, in addition to compositions and methods that include other components or steps beyond those listed in the given claim or portion of the specification. Recitation of ranges of values herein are merely intended to serve as a shorthand method of referring individually to each separate value falling within the range, unless otherwise indicated herein, and each separate value is incorporated into the specification as if it were individually recited herein. All numerical values obtained by measurement (e.g., weight, concentration, physical dimensions, removal rates, flow rates, and the like) are not to be construed as absolutely precise numbers, and should be considered to encompass values within the known limits of the measurement techniques commonly used in the art, regardless of whether or not the term "about" is explicitly stated. All methods described herein can be performed in any suitable order unless otherwise indicated herein or otherwise clearly contradicted by context. The use of any and all examples, or exemplary language (e.g., "such as") provided herein, is intended merely to better illuminate certain aspects of the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A chemical mechanical polishing (CMP) method for planarizing a nickel phosphorus (NiP) substrate, the method comprising abrading a surface of the substrate with a CMP composition; the CMP composition comprising a particulate abrasive suspended in an aqueous carrier having a pH of less than 1.5, and containing an oxidizing agent comprising hydrogen peroxide, a metal ion catalyst capable of reversible oxidation and reduction in the presence of NiP and the oxidizer, a catalyst stabilizing agent, and a Ni complexing agent, wherein the Ni complexing agent is glycine; wherein the catalyst stabilizing agent is malonic acid, and wherein the catalyst stabilizing agent is present in the CMP composition at a concentration of about 0.04 to about 0.2 wt % and present in a molar concentration of 2 to 5 times the metal ion molar concentration.

2. The method of claim 1 wherein the metal ion catalyst comprises at least one ion selected from the group consisting of ions of iron, cobalt, copper, europium, manganese, rhenium, molybdenum, iridium and tungsten.

3. The method of claim 1 wherein the metal ion catalyst is an iron ion.

4. The method of claim 3 wherein the iron ion comprises $Fe^{3+}$.

5. The method of claim 1 wherein the catalyst stabilizing agent is selected from the group consisting of oxalic acid, citric acid, malonic acid, and a combination of two or more thereof; and the metal ion catalyst comprises $Fe^{+3}$.

6. The method of claim 1 wherein the particulate abrasive is colloidal silica.

7. The method of claim 6 wherein the colloidal silica is present in the CMP composition at a concentration of about 1 to about 20 percent by weight (wt %).

8. The method of claim 1 wherein the metal ion catalyst is present in the CMP composition at a concentration of about 50 to about 150 parts-per-million (ppm).

9. The method of claim 1 wherein the oxidizing agent is present in the CMP composition at a concentration of about 0.3 to about 1.8 wt %.

10. The method of claim 1 wherein Ni complexing agent is present in the CMP composition at a concentration of about 0.3 to about 1 wt %.

11. The method of claim 1 wherein the abrading is accomplished in conjunction with a polishing pad in a CMP polishing apparatus.

* * * * *